United States Patent
Murali et al.

(10) Patent No.: US 8,916,954 B2
(45) Date of Patent: Dec. 23, 2014

(54) MULTI-LAYER METAL SUPPORT

(75) Inventors: Venkatesan Murali, San Jose, CA (US); Thomas Edward Dinan, Jr., San Jose, CA (US); Steve Bababyan, Los Altos, CA (US); Gopal Prabhu, San Jose, CA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 13/558,826

(22) Filed: Jul. 26, 2012

(65) Prior Publication Data

US 2013/0200496 A1 Aug. 8, 2013

Related U.S. Application Data

(63) Continuation-in-part of application No. 13/366,338, filed on Feb. 5, 2012.

(51) Int. Cl.
*H01L 29/06* (2006.01)

(52) U.S. Cl.
USPC ................ 257/618; 257/E21.09; 257/21.005

(58) Field of Classification Search
USPC .............................. 257/618, E21.09, E21.005
See application file for complete search history.

(56) References Cited

U.S. PATENT DOCUMENTS

| | | | |
|---|---|---|---|
| 4,451,969 A * | 6/1984 | Chaudhuri | 438/62 |
| 4,968,372 A | 11/1990 | Maass | |
| 6,091,021 A | 7/2000 | Ruby et al. | |
| 6,127,623 A | 10/2000 | Nakamura et al. | |
| 6,486,008 B1 | 11/2002 | Lee | |
| 6,518,596 B1 | 2/2003 | Basore | |
| 6,534,382 B1 | 3/2003 | Sakaguchi et al. | |
| 6,599,411 B2 | 7/2003 | Dinan et al. | |
| 6,809,044 B1 | 10/2004 | Aspar et al. | |
| 6,876,507 B2 | 4/2005 | Chen et al. | |
| 7,001,499 B2 | 2/2006 | Chen et al. | |

(Continued)

FOREIGN PATENT DOCUMENTS

| | | |
|---|---|---|
| EP | 1547146 B1 | 9/2011 |
| JP | 2003017723 A | 1/2003 |

(Continued)

OTHER PUBLICATIONS

International Search Report and Written Opinion dated May 1, 2013 for PCT Application No. PCT/US2013/024682.

(Continued)

*Primary Examiner* — David S Blum

(74) *Attorney, Agent, or Firm* — The Mueller Law Office, P.C.

(57) ABSTRACT

The invention provides a method of forming an electronic device from a lamina that has a coefficient of thermal expansion that is matched or nearly matched to a constructed metal support. In some embodiments the method comprises implanting the top surface of a donor body with an ion dosage to form a cleave plane followed by exfoliating a lamina from the donor body. After exfoliating the lamina, a flexible metal support that has a coefficient of thermal expansion with a value that is within 10% of the value of the coefficient of thermal expansion of the lamina is constructed on the lamina. In some embodiments the coefficients of thermal expansion of the metal support and the lamina are within 10% or within 5% of each other between the temperatures of 100 and 600° C.

24 Claims, 3 Drawing Sheets

(56) References Cited

U.S. PATENT DOCUMENTS

| | | | |
|---|---|---|---|
| 7,226,812 | B2 | 6/2007 | Lu et al. |
| 7,333,295 | B1 | 2/2008 | Medina et al. |
| 7,531,428 | B2 | 5/2009 | Dupont |
| 7,842,585 | B2 * | 11/2010 | Sivaram et al. ............... 438/460 |
| 7,985,604 | B2 * | 7/2011 | Isaka et al. ...................... 438/22 |
| 8,101,451 | B1 * | 1/2012 | Murali et al. ................... 438/57 |
| 8,173,452 | B1 | 5/2012 | Petti et al. |
| 8,268,645 | B2 | 9/2012 | Kell et al. |
| 8,501,522 | B2 | 8/2013 | Herner et al. |
| 2002/0174959 | A1 | 11/2002 | Yanagita et al. |
| 2003/0087479 | A1 | 5/2003 | He et al. |
| 2003/0136683 | A1 | 7/2003 | Chen et al. |
| 2005/0093100 | A1 | 5/2005 | Chen et al. |
| 2006/0021565 | A1 | 2/2006 | Zahler et al. |
| 2006/0255340 | A1 | 11/2006 | Manivannan et al. |
| 2007/0017566 | A1 | 1/2007 | Gaudiana et al. |
| 2008/0174027 | A1 | 7/2008 | Fang et al. |
| 2008/0179547 | A1 | 7/2008 | Henley |
| 2008/0265255 | A1 * | 10/2008 | Goyal ............................. 257/64 |
| 2008/0296584 | A1 * | 12/2008 | Hachigo ......................... 257/76 |
| 2009/0020592 | A1 * | 1/2009 | Lee et al. ...................... 228/205 |
| 2009/0189126 | A1 | 7/2009 | Prunchak |
| 2009/0194153 | A1 * | 8/2009 | Hilali et al. ................... 136/255 |
| 2009/0194162 | A1 | 8/2009 | Sivaram et al. |
| 2009/0194164 | A1 | 8/2009 | Sivaram et al. |
| 2009/0223562 | A1 | 9/2009 | Niira et al. |
| 2009/0280597 | A1 | 11/2009 | Wijekoon et al. |
| 2010/0129951 | A1 | 5/2010 | Henley |
| 2010/0147448 | A1 * | 6/2010 | Agarwal et al. ............... 156/241 |
| 2010/0163101 | A1 | 7/2010 | Kumar et al. |
| 2010/0224911 | A1 | 9/2010 | Okita et al. |
| 2010/0273329 | A1 | 10/2010 | Prabhu et al. |
| 2010/0307572 | A1 | 12/2010 | Bedell et al. |
| 2010/0307582 | A1 | 12/2010 | Arai |
| 2010/0319765 | A1 | 12/2010 | Choi |
| 2010/0326510 | A1 * | 12/2010 | Agarwal et al. ............... 136/256 |
| 2010/0330788 | A1 | 12/2010 | Yu et al. |
| 2011/0171812 | A1 * | 7/2011 | Letertre et al. ................ 438/458 |
| 2011/0174376 | A1 * | 7/2011 | Lochtefeld et al. ........... 136/261 |
| 2011/0186910 | A1 * | 8/2011 | Forrest et al. ................. 257/190 |
| 2011/0221040 | A1 | 9/2011 | Joshi et al. |
| 2011/0248265 | A1 | 10/2011 | Forbes |
| 2011/0311789 | A1 * | 12/2011 | Loy et al. ...................... 428/198 |
| 2012/0024377 | A1 | 2/2012 | Takanashi et al. |
| 2012/0067423 | A1 | 3/2012 | Lochtefeld et al. |
| 2012/0068345 | A1 | 3/2012 | Schmidt et al. |
| 2012/0119224 | A1 * | 5/2012 | Tai et al. ......................... 257/77 |
| 2012/0199845 | A1 | 8/2012 | Werkhoven et al. |

FOREIGN PATENT DOCUMENTS

| | | | |
|---|---|---|---|
| KR | 20060024763 | A | 3/2006 |
| KR | 20060115990 | A | 11/2006 |
| KR | 20080109711 | A | 12/2008 |
| KR | 20100097537 | A | 9/2010 |
| KR | 112011003788 | B | 1/2011 |
| KR | 20120006844 | A | 1/2012 |
| KR | 20120041165 | A | 4/2012 |
| KR | 20120050484 | A | 5/2012 |
| WO | 03003434 | A1 | 1/2003 |

OTHER PUBLICATIONS

International Search Report and Written Opinion dated May 1, 2013 for PCT Application No. PCT/US2013/024683.
International Search Report and Written Opinion dated May 16, 2013 for PCT Application No. PCT/US2013/024681.
Tsunomura et al., "22%-Efficiency Hit Solar Cell", Advanced Energy Research Center, SANYO Electric Co., LTD, Sep. 2007, pp. 1-4, Japan.
International Search Report and Written Opinion dated Sep. 16, 2013 for PCT Application No. PCT/US2013/044622.
Notice of Allowance and Fees dated Jul. 30, 2013 for U.S. Appl. No. 12/750,635.
Office Action dated Aug. 1, 2013 for U.S. Appl. No. 13/494,687.
Office Action dated Aug. 13, 2013 for U.S. Appl. No. 13/366,338.
Office action dated Jul. 22, 2013 for U.S. Appl. No. 13/558,836.
Examination Report dated Feb. 5, 2014 for European Patent Application No. 09152007.2.
International Search Report and Written Opinion dated Jan. 29, 2014 for PCT Application No. PCT/US2013/053316.
International Search Report and Written Opinion dated Nov. 27, 2013 for PCT Application No. PCT/US2013/051541.
Office Action dated Feb. 12, 2014 for U.S. Appl. No. 13/366,338.
Office Action dated Jan. 15, 2014 for U.S. Appl. No. 13/558,836.
Office Action dated Jan. 8, 2014 for Chinese Patent Application No. 200910000496.1.
Notice of Allowance and Fees dated Mar. 24, 2014 for U.S. Appl. No. 13/558,843.
Notice of Allowance and Fees dated May 28, 2014 for U.S. Appl. No. 13/366,338.
Office Action dated Apr. 10, 2014 for U.S. Appl. No. 13/494,687.
Office Action received May 8, 2014 for U.S. Appl. No. 13/964,056.
International Search Report and Written Opinion dated Nov. 26, 2013 for PCT Patent Application No. PCT/US2013/054443.
Office Action dated Nov. 18, 2013 for U.S. Appl. No. 13/494,687.
Office Action dated Nov. 8, 2013 for U.S. Appl. No. 13/689,628.
Official Letter and Search report dated Sep. 24, 2013 for Taiwanese application No. 98102109.

* cited by examiner

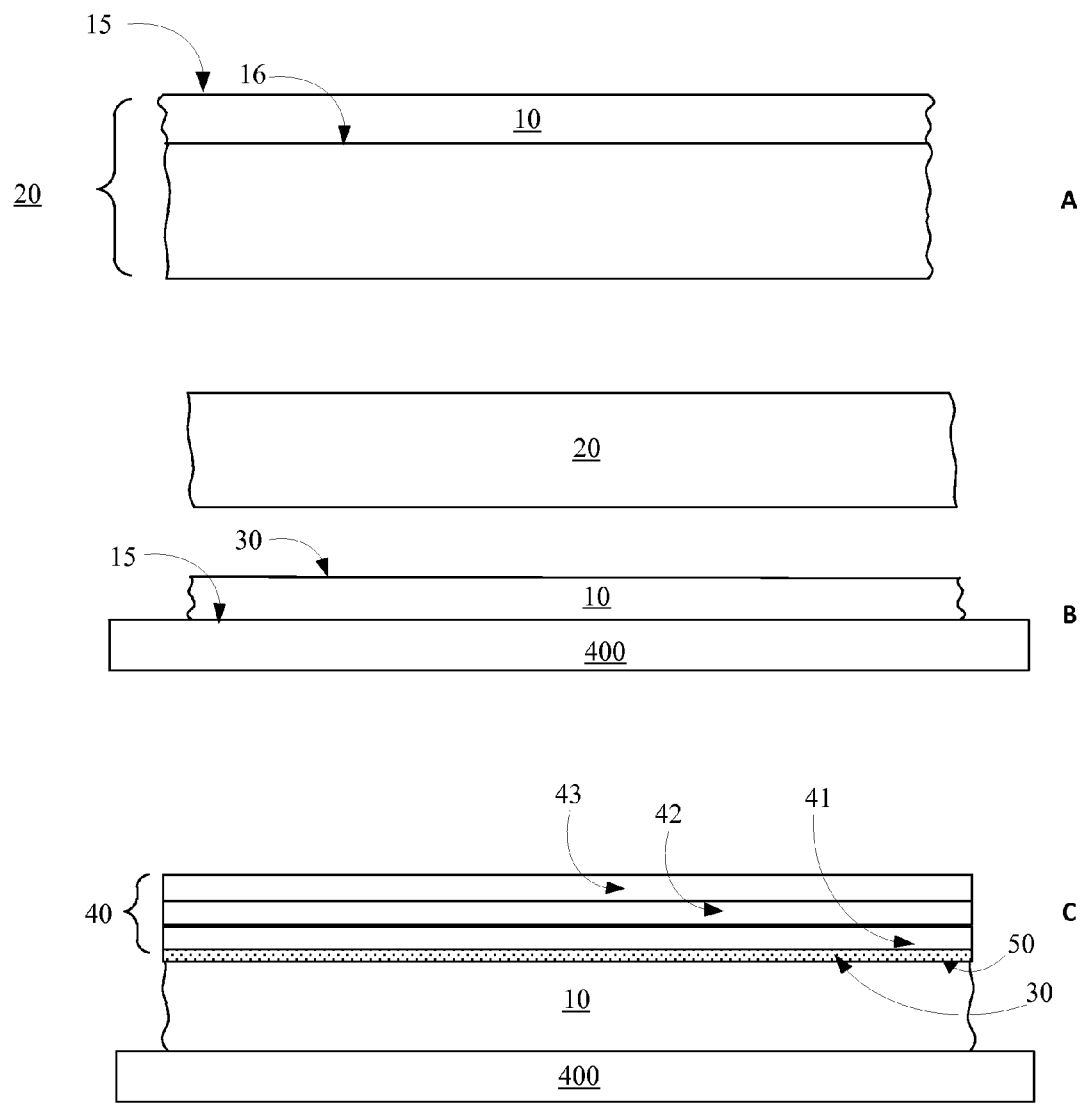
FIGURES
2A-2C

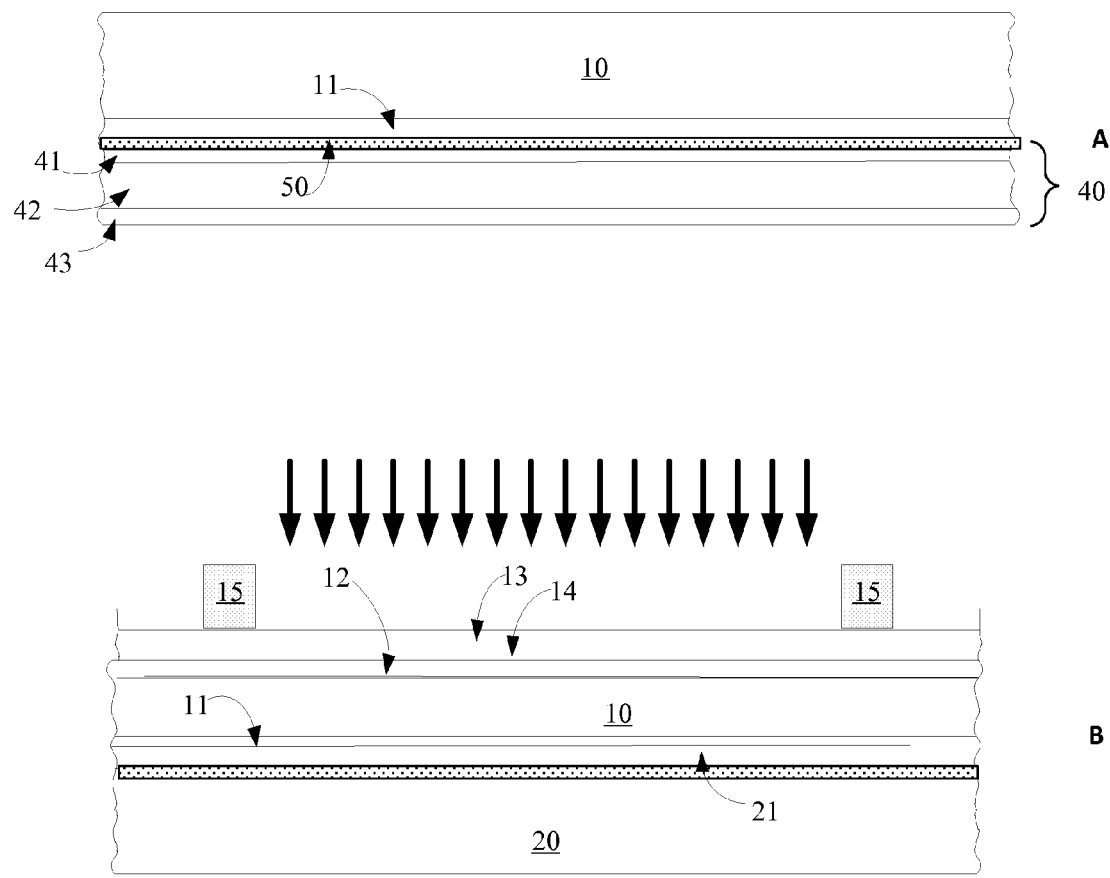
FIGURES
3A-3B

MULTI-LAYER METAL SUPPORT

RELATED APPLICATIONS

This application is a continuation in part of Murali et al., U.S. patent application Ser. No. 13/366,338, "Method for Forming Flexible Solar Cells" filed on Feb. 5, 2012, which is hereby incorporated by reference for all purposes. This application is related to Murali et al., U.S. patent application Ser. No. 13/558,836, "Multi-Layer Metal Support" filed on Jul. 26, 2012, and now abandoned, owned by the assignee of the present application, and hereby incorporated by reference.

BACKGROUND

In conventional methods for fabricating photovoltaic cells and other electronic devices from semiconductor wafers, the wafer is generally thicker than actually required by the device. Making thinner semiconductor lamina from wafers requires methods and materials to support the lamina. Improved methods and apparatus to produce electronic devices utilizing thin lamina are useful in a variety of configurations.

SUMMARY OF THE INVENTION

The invention provides for a method of forming an electronic device by providing a donor body comprising a top surface and a coefficient of thermal expansion. The top surface of the donor body is implanted with an ion dosage to form a cleave plane followed by exfoliating a lamina from the donor body. The step of exfoliating the lamina forms a first surface of the lamina, wherein the first surface is opposite the top surface of the donor body and the top surface of the donor body becomes the second surface of the lamina. The lamina is between 2 and 40 microns thick between the first surface and the second surface. After exfoliating, a flexible metal support is constructed on the lamina, wherein the flexible metal support has a coefficient of thermal expansion with a value within 10% of the value of the coefficient of thermal expansion of the lamina. In some embodiments the coefficients of thermal expansion of the metal support and the lamina are within 10% or within 5% of each other between the temperatures of 100 and 600° C.

BRIEF DESCRIPTION OF DRAWINGS

FIGS. 2A through 2C are cross sectional views showing stages of photovoltaic device formation according to embodiments of the present invention.

FIGS. 3A and 3B are cross sectional views showing stages of photovoltaic assembly according to embodiments of the present invention.

DETAILED DESCRIPTION OF THE EMBODIMENTS

Figure 1:
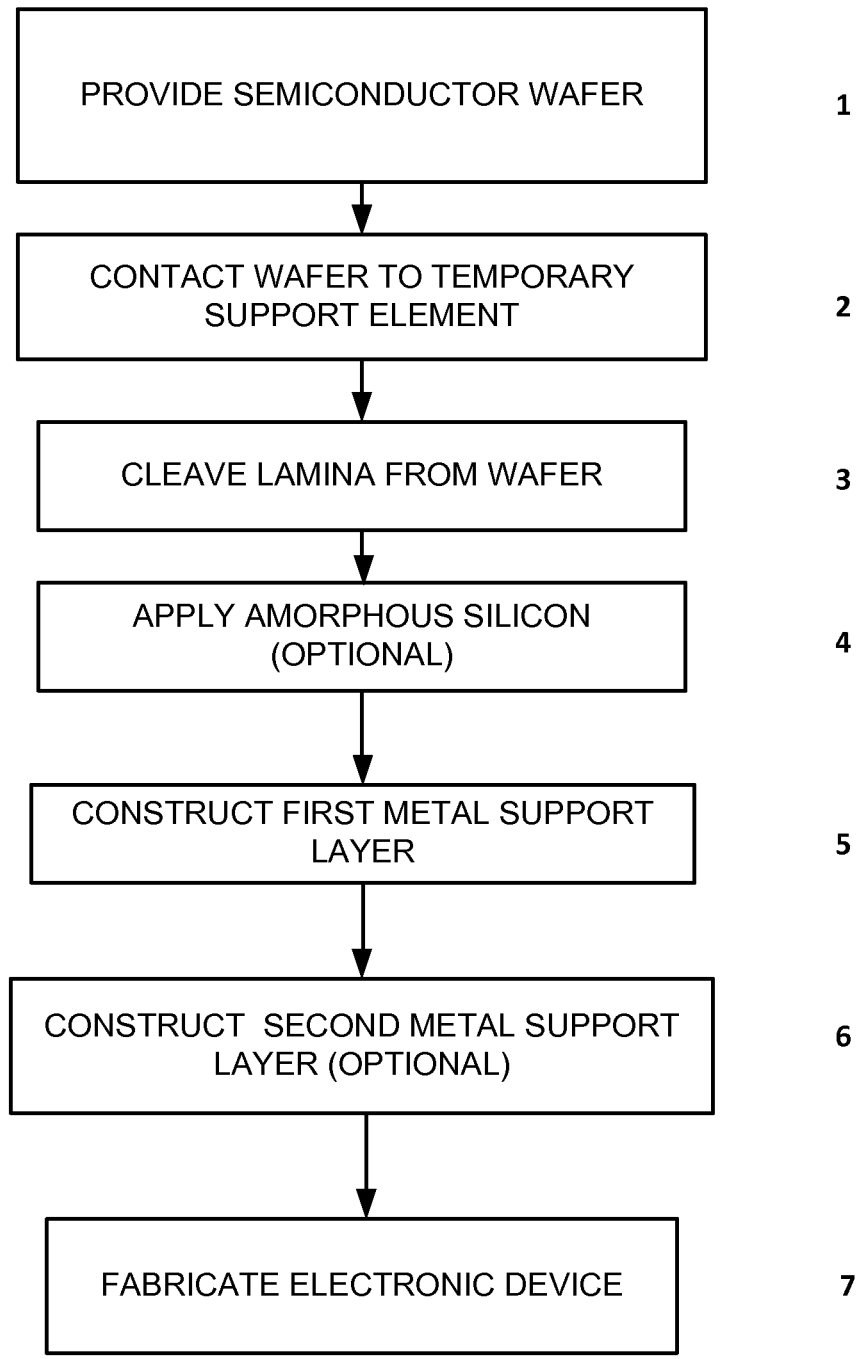
FIG. 1 shows a schematic representation of an embodiment of a method of this invention.

An electronic device may be formed from a semiconductor lamina that is cleaved from a donor wafer at a desired thickness and a flexible metal support element that is constructed on it. The constructed metal support element and the lamina each have a coefficient of thermal expansion (CTE) that is matched or nearly matched (i.e., CTEs within 10% each other) over a particular range of temperatures such as between 100 and 600° C. or between 600 and 1000° C. The resultant assembly may be stable over a wide range of processing temperatures during fabrication or use of the device. The resultant device may sag or bend while remaining usable as an electronic device. The device is stabilized by the flexible metal support element that is constructed on or above a surface of the lamina before or after it is cleaved from the wafer. The values of CTE of the flexible metal support and the lamina are within 10% or 5% less of each other over any temperature range, such as between the temperatures of 100 and 1000° C. or between 100 and 500° C. or between 300 and 600° C. or between 600 and 900° C., beneficially providing for a flexible support during the high temperature steps utilized to process the lamina into an electronic device. The metal support element may comprise one or more layers of a metal or metal alloy, such as a metal alloy comprising nickel, molybdenum, iron, cobalt or any combination thereof. Metals and metal alloys are typically transferred to semiconductor materials as completely fabricated thin films on glass or other surfaces, and used as back contacts for photovoltaic cells and other electronic devices, often after much of the device fabrication is completed. By constructing a metal support on a thin lamina rather than attaching a metal film to the lamina it is possible to build an electronic device comprising the metal support without the need to bind the lamina to a heat resistant temporary carrier or adhesive to facilitate further processing.

Sivaram et al., U.S. patent application Ser. No. 12/026,530, "Method to Form a Photovoltaic Cell Comprising a Thin Lamina," filed Feb. 5, 2008, and Kell et al., U.S. patent application Ser. No. 13/331,909, "Method and Apparatus for Forming a Thin Lamina" filed Dec. 20, 2011, both of which are owned by the assignee of the present invention and are hereby incorporated by reference, describe the fabrication of a photovoltaic cell comprising a thin semiconductor lamina formed of non-deposited semiconductor material. Using the methods of Sivaram et al. and others, photovoltaic cells and other electronic devices, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use. In some embodiments a metal support element may be constructed on the thin semiconductor lamina obtained by methods of Sivaram et al., and may be used for variety of devices in addition to photovoltaic devices, such as CMOS devices, substrates for 3-D semiconductor packages, LED devices and the like. In some embodiments the metal support element may be constructed on a free standing lamina after it is cleaved from the donor wafer as described in Murali, et al., U.S. patent application Ser. No. 12/980,424, "A Method to Form a Device by Constructing a Support Element on a Thin Semiconductor Lamina", filed Dec. 10, 2010, owned by the assignee of the present invention and hereby incorporated by reference. In some embodiments the metal support element may be applied to the surface of the donor wafer before a lamina is cleaved, resulting in a cleaved lamina with a metal support, obviating any need for a temporary support element.

An embodiment of the process is schematically illustrated in FIG. 1. The process may begin with a semiconductor donor wafer of an appropriate material 1. An appropriate donor wafer may be a semiconductor wafer of any practical thickness, for example from about 150 to about 1000 microns thick or more, the semiconductor wafer having a first surface and a second surface opposite the first surface. The semiconductor wafer may comprise monocrystalline silicon. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, GaN, InP, SiC, SiN etc. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants. The semiconductor wafer may be contacted to a temporary element 2 in order to support the lamina as it is cleaved from the wafer. The temporary element may be any rigid support, for example, a silicon wafer, a glass wafer, an alumina wafer, a quartz wafer. In some embodiments the temporary support element may be an adhesive based carrier or a vacuum chuck or an electrostatic chuck or the like. The lamina may be cleaved from the donor wafer 3 by any means such as the methods of Sivaram or Kell as described above, and the lamina contacted to the temporary support may be processed further. Conventionally, further processing may comprise contacting the lamina to a pre-formed layer of metal while the lamina is affixed to a support element. The metal layer is not required to be CTE matched to the lamina because high temperature steps are generally performed before the metal layer is applied. A metal layer is not contacted to a lamina as a support element in a CTE matched manner because other material such as glass or silicon are typically employed as temporary or permanent. The method of this invention beneficially provides for the support structure to be permanently affixed to the lamina as part of the device, early enough in the processing in a manner that is resistant to exposure to elevated temperatures in a manner that is cost effective and reduces the number of overall steps used in processing.

An intervening layer such as an optional amorphous silicon layer 4 may be applied to a surface of the lamina before the construction of the metal support element. The metal support element may be constructed on or above a surface of the cleaved lamina in a continuous manner that covers the lamina entirely or patterned manner over regions of the surface. The metal support element may be constructed by any means such as electroplating, electro-less plating, evaporation, sputtering or any combination thereof. The metal layers may have any thickness such as a total of between 2 and 100 microns (e.g., between 2 and 10, 10 and 25, 25 and 50 or 25 and 100 microns). A first layer of a metal support element 5 may be constructed on or above the first surface of the lamina in order to provide support and flexibility to the lamina after the removal of the temporary support and to provide a closely matched CTE material in proximity to the lamina. The first layer may be between 2 and 100 microns (e.g., between 2 and 5, 2 and 10, 10 and 25, 25 and 50 or 25 and 98 microns). A second layer of the metal support 6 may be optionally constructed on the first layer 6. The second layer may be between 2 and 100 microns (e.g., between 2 and 5, 2 and 10, 10 and 25, 25 and 50, or 25 and 98 microns). The first layer of the metal support element may provide a barrier between the lamina and the second metal layer in order to shield the lamina from potentially contaminating particles in the second layer of the metal support element. The second layer may provide additional physical support for the lamina and/or a more closely matched CTE material. A third layer of metal may be optionally constructed on the lamina as part of the metal support. The third layer may beneficially cap or isolate potential contaminants in the second layer from the lamina or surrounding media. The third layer may be between 2 and 100 microns (e.g., between 2 and 5, 2 and 10, 10 and 25, 25 and 50, or 25 and 98 microns). An electronic device 7 may then be constructed by any means from the lamina and metal support such as by the application of additional layers and elements to the semiconductor lamina or metal support (e.g., amorphous silicon layer, an antireflective coating, front contacts, back contacts, epitaxial growth etc.). Any layer of the metal support may have a CTE that is within 10% or 5% or less of the CTE of the thin lamina within a desired temperature range, providing for additional processing at a wide range of temperatures with minimal damage to the lamina from stress caused by a mismatched bound support. For example, any one or more layers of the metal support may have a CTE within 10% of the CTE of the thin lamina within 100 and 500° C., or within 500 and 1000° C. or within 600 to 900° C.

Following the construction of the metal support element on the surface of the wafer, additional layers, such as an amorphous silicon layer and/or an indium tin oxide (ITO) layer or other layers may be deposited on the same or the opposite surface of the lamina, depending on the device to be fabricated. In some embodiments amorphous silicon may be optionally applied to one or both surfaces of the lamina after it is cleaved from the wafer, before or after the construction of metal support element at temperatures around 500° C. or more. In some embodiments, germanium or other semiconductor material may be epitaxially grown on the thin lamina at temperature in excess of 600° C. after the construction of the metal support layer on the lamina. A photovoltaic assembly may be fabricated and a flexible glass or plastic layer may be applied to a surface of the device to form a cover for the assembly. The glass or plastic may be thin (e.g., less than 500 μm thick) and/or flexible in order to provide for a flexible or sag tolerant photovoltaic assembly. A flexible electronic device may be formed with a radius of curvature that is less than 3 cm by utilizing a lamina less than 40 μm thick and constructing a flexible metal support on the lamina. In other embodiments an LED or CMOS device may be fabricated from the lamina and constructed metal support.

FIGS. 2A through 2C illustrate an embodiment of the method whereby a metal support is constructed on a thin lamina. Referring to FIG. 2A, a semiconductor donor wafer 20 is implanted through a top surface 15 with one or more species of gas ions, for example hydrogen and/or helium ions. The implanted ions define a cleave plane 16 within the semiconductor donor wafer 20 and the region 10 to be exfoliated. As shown in FIG. 2B, donor wafer 20 may be contacted at top surface 15 to temporary support element 400. The temporary support element 400 may be, for example, a silicon wafer, a glass wafer, an aluminum wafer, a quartz wafer or any support made out of any other stiff material. In some embodiments the temporary support element 400 may be an adhesive based carrier or a vacuum chuck or an electrostatic chuck or the like. In embodiments of Kell et al., lamina 10 may be free standing after exfoliation and not bonded to any support element such as support element 400, but merely contacted to the support element via the weight of the lamina or vacuum force, electrostatic force or any combination thereof. For the purposes of this disclosure, the term "carrier" shall be used interchangeably with "support element" and "susceptor." An exfoliation/anneal step causes a lamina 10 to cleave from donor wafer 20 at cleave plane 16, creating a second surface 30. The lamina may be between 0.2 and 200 μm thick, for example between about 2 and about 40 μms thick, in some embodiments between about 1 and about 10 μms thick or between about 4 and about 20 or between about 5 and about 15 μms thick, though any thickness within the named ranges is possible. In some embodiments a plurality of donor wafers may be affixed to a single, larger carrier, and a lamina cleaved from each donor wafer.

Following the separation of the lamina from the donor wafer, a metal support element 40 may be constructed on surface 30 of lamina as shown in FIG. 2C. In some embodiments, a continuous metal support element may cover substantially the entire first surface of the lamina or greater than 50% of the first surface of the lamina or intervening layers 50 disposed on the lamina. In some embodiments a patterned metal support element may be a grid or mosaic pattern of metal that is applied to the lamina or to intervening layers disposed on the wafer. The metal support element 40 may comprise one or more layers 41, 42, 43. Any one or more of the layers may beneficially provide for a layer with matched or nearly matched CTE while at the same time the bottom-most 41 and/or topmost layer 43 may provide a cap or barrier to protect regions of the lamina from contaminating elements in the metal support. In some embodiments the layer closest to the lamina may have the closest matched CTE, and additional layers may provide additional structural support. One or more layers of the metal support element may have substantially the same coefficient of thermal expansion as the lamina over the operating temperatures of the electronic device and/or over the processing temperatures needed to fabricate the electronic device.

In some embodiments the support element may comprise a first metal layer 41 such as nickel or molybdenum or the like, followed by a second metal layer 42 such as a Ni:Fe or Ne:Fe:Co alloy. Ni:Fe or Ne:Fe:Co alloys each have a coefficient of thermal expansion that is better matched to that of silicon than pure nickel, reducing stress caused by thermal expansion during subsequent high temperature steps. Utilizing some nickel-only layers may lower the material cost of the assembly relative to using Ni:Fe:Co for the full thickness of the metal support element, but any combination may be used. The thickness of metal support element 40 may be as desired. The metal support element should be thick enough to provide structural support for the electronic device to be formed while maintaining a desired flexibility. For example, for thin lamina that are less than 30 μm thick, the metal support element should provide structural and flexural support for bends up to a 1 cm radius of curvature, while for lamina that are less than 150 μm thick, the metal support need only provide stability under flexural stress such the sagging of a rooftop photovoltaic module, (e.g., on the order of a 1 meter radius of curvature or less). One skilled in the art will select a suitable thickness and nickel:cobalt alloy ratio to balance these concerns. The thickness of metal support element 40 may be, for example, between about 25 and about 100 microns, for example about 50 microns. In some embodiments, the nickel:iron:cobalt alloy is between about 40 and about 65 percent iron, for example 54 percent iron. In some embodiments the metal support element will be a sandwich of three metal layers (e.g., Ni—Fe:Co:Ni—Ni). The nickel first and third layers may provide a diffusion barrier or cap to prevent iron or other trace metals that may be present during the Ni:Fe:Co plating process from contaminating the lamina.

A layer of molybdenum 41 may be constructed on some non-silicon laminas in order to provide constructed metal support with a matched or nearly matched coefficient of thermal expansion. The CTE of molybdenum is better matched to that of germanium or GaAs or GaN than pure nickel or other metals, and may provide for support with reduced stress during high temperature steps such epitaxial growth of subsequent semiconductor layers. In some embodiments a Ni:Fe layer 42 may provide extra support for a thin molybdenum layer, while the molybdenum layer 41 may provide the closest matched CTE for a germanium or GaAs or GaN lamina 10. A third layer 43 may comprise molybdenum, nickel or other metal and also shield the lamina from released Fe or Co or other contaminants. Molybdenum may be applied by sputtering or any method known in the art for constructing a molybdenum layer on a surface. A support element is considered to be "constructed" if it is formed in situ, rather than being provided as a pre-formed element such as a thin film on glass or other support. Examples of a constructed metal support include: a metal support element formed by plating, such as by electroplating or electro-less plating or sputtering. The metal support element may be sufficiently thick so as to provide mechanical support to wafer, which may be too thin and fragile to survive much handling without such support, and additionally provide sufficient flexibility such that the completed electronic device is capable of adopting a radius of curvature of one meter or less. The flexible metal support element of this invention beneficially provides for the fabrication of an electronic device that may sag or flex without significantly impacting the efficiency of the device. The matched or nearly matched coefficient of thermal expansion between the support 40 and the lamina 10 over any range of temperatures may provide for a stable, flexible support throughout a range of temperatures during the fabrication and/or utilization of an electronic device.

For clarity, detailed examples of a lamina having thickness between 2 and 150 μms, such as between 20 and 100 μms, in which a metal support element is constructed on the lamina, are provided in FIGS. 3A and 3B. FIG. 3A illustrates a semiconductor lamina 10 less than 50 μm thick in contact with a flexible metal support element 40. The metal support element 40 may be between 2 and 100 μms thick, such as less than 30 μm thick, or less than 20 or less than 10 μm thick. The metal support element 40 may be comprised of one or more layers (41, 42, 43) and have the same, or substantially the same, coefficient of thermal expansion as the lamina. The layers 41, 42 and 43 may comprise molybdenum, nickel, nickel alloy or any combination thereof. In some embodiments the metal support element 40 may comprise three layers made up of a first layer of nickel 41, a second layer of iron-cobalt-nickel (Fe:Co:Ni) alloy 42 and third layer of nickel 43. The total thickness of the metal support element may be any thickness needed to retain structural integrity while providing for sag tolerance and/or flexibility in the photovoltaic cell. In some embodiments the total thickness of the metal support element 40 may be between 2 and 100 μm thick, such as between 2 and 40 μm, or between 2 and 30 μm, or between 2 and 10 μm thick. In some embodiments the metal support element 40 may be less than 7 μm thick and comprise a layer 42 of Fe:Co:Ni alloy that is less than 6 μm, for example 5 μm, thick and a layer of nickel 41 than is less than 1 μm thick. In some embodiments the metal support element 40 may be less than 30 μm thick and comprise a layer 42 of Fe:Co:Ni alloy that is less than 25 μm, for example 20 μm, thick and a layer of nickel 41 than is less than 5 μm thick. At least one of the metal layers 41, 42 or 43 has a coefficient of thermal expansion that is within 10% or 5% or less of the CTE of the semiconductor lamina 40 within a defined temperature range, such as between 100 and 600° C. or between 600 and 1000° C. A balance in the CTEs may be achieved by adjusting the thickness and/or the composition of the metal support element. The matched or nearly matched coefficient of thermal expansion beneficially provides for improved structural integrity of the lamina during fabrication of an electronic device and the usage of the device. For example, a matched or nearly matched coefficient of thermal expansion in the metal support and the lamina provides for a reduction of cracking or tearing in the lamina relative to a lamina bound to a support element with a mismatched coefficient of thermal expansion such as during the application of an amorphous silicon layer to the lamina.

In some embodiments there may be one or more intervening layers 11 between the silicon wafer 10 and the metal support element 40. The intervening layers 11 may comprise, for example, amorphous silicon, transparent conductive oxide, reflective metals, seed metals (e.g., silver), adhesion layers (e.g., chromium), anti-reflection coatings (ARC, TCO) or any combination thereof. Seed layer 50 comprising silver, chrome or other metal may be used to facilitate the construction of the metal support element 40 when electroplating is used to apply the metal layer. In some embodiments the metal support element 40 is constructed by electroplating a metal onto a seed metal layer 50 that is applied to the first surface of the wafer or to intervening layers 11 (e.g., an optional amorphous silicon layer, a reflective metal layer, etc.).

The opposite surface of the semiconductor lamina may comprise any additional layers or material to provide for an electronic device such a photovoltaic assembly. Additional layers are shown in FIG. 3B and include an amorphous silicon layer 12 disposed on the second side of the lamina 10. The amorphous silicon layer 12 may be doped with an opposite conductivity as the lamina 10 and comprise the emitter region of a photovoltaic cell. In some embodiments, a transparent conductive oxide (TCO) layer 13 may be formed on the amorphous silicon layer 12. In some embodiments, a layer 14 having a refractive index between that of the amorphous silicon layer 12 and the TCO layer 13 may be disposed between the amorphous silicon layer 12 and the TCO layer 13. Metal lines 15, for example of silver paste, may be formed on TCO layer 13 and provide for top electrical contacts for the photovoltaic cell. It will be understood, however, that many of these details can be modified, augmented, or omitted while the results fall within the scope of the invention.

In some embodiments the lamina may be any material suitable for growing an epitaxial layer such as germanium, silicon carbide or silicon nitride. A metal support may be constructed on the lamina that provides a CTE matched support at temperatures amenable to epitaxial growth, such as between 500 and 1000° C. or between 600 and 900° C. Germanium, gallium nitride, aluminum gallium nitride, aluminum nitride, or other material may be epitaxially grown on the lamina supported by the metal support and a light emitting device (LED), high electron mobility transistor (HEMT) or other device may be constructed that comprises the metal support, lamina, and epitaxially grown material.

Example

Constructed Support Element Comprising Nickel

The process begins with a donor body of an appropriate semiconductor material. An appropriate donor body may be a monocrystalline or multi-crystalline silicon wafer of any practical thickness, for example from about 200 to about 1000 microns thick or more. Typically a monocrystalline wafer has a <100> orientation, though wafers of other orientations may be used. The monocrystalline silicon wafer is lightly to moderately doped to a first conductivity type. The present example will describe a relatively lightly n-doped monocrystalline silicon wafer but it will be understood that in this and other embodiments the dopant types can be reversed. The wafer may be doped to a concentration of between about $1 \times 10^{15}$ and about $1 \times 10^{18}$ dopant atoms/cm$^3$, for example about $1 \times 10^{17}$ dopant atoms/cm$^3$. The donor wafer may be, for example, any solar- or semiconductor-grade material.

In the next step, ions, preferably hydrogen or a combination of hydrogen and helium, are implanted into the wafer to define a cleave plane, as described earlier. This implant is performed using, for example, the implanter described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference, but any method may be used. The overall depth of the cleave plane is determined by several factors, including implant energy. The depth of the cleave plane can be between about 0.2 and about 100 microns from the implant surface, for example between about 0.5 and about 20 or about 50 microns, for example between about 2 and about 20 microns or between about 1 or 2 microns and about 15 to 20 microns.

Prior to exfoliation of a lamina from the semiconductor donor body, a first surface of the donor body is separably contacted to a temporary support element, such as a susceptor assembly. The contact between the donor body and the susceptor assembly is an adhering force, but may comprise any type of separable force or adherence such as a vacuum, or electrostatic force. Following the contacting of the donor body to the susceptor assembly, heat is applied to the donor body to exfoliate a lamina from the donor body at the cleave plane, forming a lamina with a first surface 15 and second surface 30 as described in FIG. 2B. A first layer of amorphous silicon is then applied to the cleaved surface. The amorphous silicon may between 2 and 200 nm thick, such as 25 nm thick applied by any method such as plasma-enhanced chemical vapor deposition (PECVD). Next, a layer of aluminum is applied to the amorphous silicon to form a reflective layer. Other materials may be used to form a reflective layer such as chromium or silver. The reflective metal layer may between 1 and 1000 nm thick, such as between 50 and 150 nm thick.

In the next step, a metal support element is constructed by plating. Conventional plating cannot be performed onto an aluminum layer, so if aluminum is first applied to the second surface as a reflective layer, an additional layer or layers must be added to provide for appropriate adhesion during plating. A layer of titanium is applied, for example, between about 200 and about 300 angstroms thick. This is followed by a seed layer of cobalt, which may have any suitable thickness, for example about 500 angstroms. The flexible metal support element is then constructed on the lamina by plating on the reflective layer. To form a metal support element by electroplating, the lamina and associated layers are immersed in an electrolyte bath. An electrode is attached to the reflective layer, and a current passed through the electrolyte. Ions from the electrolyte bath build up on the reflective layer, forming a metal support element. The metal support element is, for example, comprised of three layers: first a nickel layer may be applied, followed by an alloy of nickel, iron and cobalt, and finished with another layer of nickel. Any number of steps may occur after the flexible metal support is constructed on the thin lamina. In this example a photovoltaic assembly is fabricated. A second amorphous silicon layer is deposited on the second surface. This layer is heavily doped silicon and may have a thickness, for example, between about 50 and about 350 angstroms. In this example, the second layer is heavily doped p-type, opposite the conductivity type of lightly doped n-type wafer, and serves as the emitter of the photovoltaic cell. A transparent conductive oxide (TCO)

layer is formed on and in immediate contact with the second amorphous silicon layer. Appropriate materials for TCO include indium tin oxide and aluminum-doped zinc oxide. This layer may be, for example, about between about 700 to about 1800 angstroms thick, for example about 900 angstroms thick. In some embodiments, a layer having a refractive index between that of the amorphous silicon layer and TCO layer, may be formed on the amorphous silicon layer, as described in Liang et al., U.S. patent application Ser. No. 12/894,254, "A Semiconductor with a Metal Oxide Layer Having Intermediate Refractive Index," filed Sep. 30, 2010, owned by the assignee of the present application and hereby incorporated by reference. Metal lines, for example of silver paste, may be formed on TCO layer, for example by screen printing, and cured at a relatively low temperature, for example about 180-250 degrees C.

A photovoltaic cell has been formed, including a lightly doped n-type wafer, which comprises the base of the cell, and a heavily doped p-type amorphous silicon layer, which serves as the emitter of the cell. Heavily doped n-type amorphous silicon layer will provide good electrical contact to the base region of the cell. Electrical contact must be made to both faces of the cell. Contact to the amorphous silicon layer is made by gridlines, by way of a TCO layer. The metal support element is conductive and is in electrical contact with the base contact by way of the conductive layer and TCO layer. The photovoltaic cells of a module are flexible and/or sag tolerant and generally electrically connected in series.

Example

Support Element Comprising Molybdenum

The process begins with a donor body of an appropriate semiconductor material such as germanium, gallium arsenide, silicon nitride, silicon carbide or gallium nitride. These materials have a coefficient of thermal expansion that is different than silicon-based semiconductors and therefore the composition of the constructed metal support element is modified. For simplicity this discussion will describe the use of a monocrystalline germanium wafer as the semiconductor donor body, but it will be understood that donor bodies of other types and materials can be used and the constructed metal support element modified.

The monocrystalline germanium wafer is lightly to moderately doped to a first conductivity type. The present example will describe a relatively lightly n-doped wafer but it will be understood that in this and other embodiments the dopant types can be reversed. The wafer may be doped to a concentration of between about $1\times10^{15}$ and about $1\times10^{18}$ dopant atoms/$cm^3$, for example about $1\times10^{17}$ dopant atoms/$cm^3$. The donor wafer may be, for example, solar- or semiconductor-grade germanium. In the next step, ions, preferably hydrogen or a combination of hydrogen and helium, are implanted into wafer to define cleave plane, as described earlier. This implant may be performed using the implanter described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of the cleave plane is determined by several factors, including implant energy. The depth of the cleave plane can be between about 0.2 and about 100 microns from the implant surface, for example between about 0.5 and about 20 or about 50 microns, for example between about 2 and about 15 microns or between about 1 or 2 microns and about 5 or 6 microns.

Prior to exfoliation of the lamina from a semiconductor donor body, a first surface of donor body of the present invention is separably contacted to a temporary support element, such as a susceptor assembly. The contact between the donor body and the susceptor assembly is comprised of an adhering force, but any force may be utilized such as vacuum or electrostatic. Following the contacting of the donor body to the susceptor assembly, heat or other force may be applied to the donor body to cleave a lamina from the donor body at the cleave plane, forming a lamina with a first surface 15 and second 30 surface (FIG. 2B). Exfoliation conditions are optimized to cleave the lamina from the donor body in order to minimize physical defects in a lamina exfoliated in the absence of an adhered support element. The contact between the susceptor assembly and the lamina may be direct or there may be any number of intervening layers or materials between lamina and susceptor, such as layers of amorphous silicon or metal, electrical contacts, regions of doped material or any other material or layers of material.

A metal support is constructed on the newly formed surface of the lamina at the cleave plane. The metal support element comprises a first layer of molybdenum that is sputter deposited using a DC magnetron and molybdenum target in a high vacuum system. The layer is deposited near room temperature resulting in a molybdenum (Mo) layer that is approximately 2 μm thick. The Mo layer may be any thickness such as between 0.1 and 10 μm thick (e.g., 0.2, 1, 2, 5 or more μm thick). A second layer of the constructed metal support comprising nickel is electroplated on the molybdenum layer. The second layer may comprise pure nickel or a nickel alloy such as Ni:Fe or Ni:Fe:Co in order to provide additional stability to the thin lamina. The constructed metal support may include a third layer comprising molybdenum to provide a cap layer on the metal support.

After the metal support is constructed on the second side of the lamina, additional processing of the thin lamina may proceed. A layer of p-doped germanium is grown by metalorganic vapor phase epitaxy methods at temperatures in excess of 500° C. The lamina is supported and stabilized by the flexible metal support at this time. In some embodiments epitaxially grown layers are formed on the first surface of the lamina in order to fabricate an electronic device such as a photovoltaic device, or Complementary Metal Oxide Semiconductor (CMOS) or light emitting device (LED) or high electron mobility transistor (HEMT).

A variety of embodiments have been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

The invention claimed is:

1. A method of forming an electronic device, the method comprising the steps of:
   a. providing a donor body comprising a top surface;
   b. implanting the top surface of the donor body with an ion dosage to form a cleave plane;
   c. exfoliating a lamina from the donor body, wherein the step of exfoliating the lamina forms a first surface of the lamina, wherein the top surface of the donor body becomes a second surface of the lamina, wherein the first surface is opposite the second surface, wherein the lamina is between 2 and 40 microns thick between the first surface and the second surface, and wherein the lamina has a first coefficient of thermal expansion; and
   d. after the step of exfoliating, constructing a flexible metal support on the lamina, wherein the flexible metal support has a second coefficient of thermal expansion, and wherein the second coefficient of thermal expansion is within 10% of the first coefficient of thermal expansion of the lamina between the temperatures of 100 and 600° C.

2. The method of claim 1 wherein constructing the flexible metal support on the lamina comprises constructing the flexible metal support on the first surface of the lamina.

3. The method of claim 1 wherein constructing the flexible metal support on the lamina comprises constructing the flexible metal support on the second surface of the lamina.

4. The method of claim 1 further comprising the step of applying a temporary carrier to the lamina prior to constructing the flexible metal support on the lamina.

5. The method of claim 1 wherein the flexible metal support is between 2 and 100 microns thick.

6. The method of claim 1 further comprising the step of forming an electronic device comprising the lamina and the flexible metal support, after the step of constructing the flexible metal support on the lamina.

7. The method of claim 6 wherein the electronic device is selected from the group consisting of a photovoltaic assembly and a light emitting device.

8. The method of claim 1 wherein the flexible metal support comprises a first layer comprising nickel and a second layer comprising a Ni:Fe alloy and a third layer comprising nickel, wherein the second layer is between the first layer and the third layer.

9. The method of claim 8 wherein the Ni:Fe alloy comprises cobalt.

10. The method of claim 1 wherein the step of constructing the flexible metal support comprises electro-less plating.

11. The method of claim 1 wherein the step of constructing the flexible support comprises electroplating.

12. The method of claim 1 wherein the donor body comprises a material selected from the group consisting of monocrystalline silicon, germanium, gallium arsenide, and gallium nitride.

13. A method of producing an electronic device from a donor body, the method comprising the steps of:
   a. providing a lamina having a first side and a second side opposite the first side, a thickness between the first side and the second side, and a first coefficient of thermal expansion, wherein the thickness is less than 40 µm;
   b. contacting the first side of the lamina to a temporary carrier;
   c. constructing a flexible metal support comprising a nickel:iron alloy on the second side of the lamina, wherein the flexible metal support has a second coefficient of thermal expansion that is within 10% of the first coefficient of thermal expansion of the lamina between the temperatures of 100 and 600 degrees Celsius; and
   d. forming an electronic device comprising the lamina and the flexible metal support.

14. The method of claim 13 wherein the electronic device is a photovoltaic assembly.

15. The method of claim 13 wherein the electronic device is a light emitting device.

16. The method of claim 13 wherein the step of contacting a temporary carrier to the first side of the lamina occurs prior to constructing the flexible metal support on the second side of the lamina.

17. The method of claim 13 wherein the electronic device is capable of adopting a radius of curvature that is one meter or less.

18. The method of claim 14 further comprising the step of applying a layer of amorphous silicon to the second side of the lamina, wherein the layer amorphous silicon is disposed between the lamina and the flexible metal support.

19. The method of claim 14 wherein the step of forming the electronic device comprises applying a layer of amorphous silicon to the first side of the lamina, and wherein the layer of amorphous silicon comprises an emitter of the photovoltaic assembly.

20. The method of claim 14 wherein the step of constructing a flexible metal support comprises constructing a continuous layer of metal on or over the second side of the lamina, wherein the continuous layer of metal covers the entire surface of the second side of the lamina.

21. An electronic device comprising;
   a. a semiconductor lamina, wherein the lamina has a thickness between 2 microns and 40 microns, wherein the lamina has a first surface and a second surface opposite the first surface, and wherein the lamina has a first coefficient of thermal expansion; and
   b. a metal support element constructed on or above the first surface; wherein the metal support element comprises a first metal layer comprising nickel and a second metal layer comprising a comprising nickel, iron, cobalt or any combination thereof, and wherein the metal support element has a second coefficient of thermal expansion, wherein the first coefficient of thermal expansion of the lamina and the second coefficient of thermal expansion of the metal support are within 10% of each other between the temperatures of 100 and 600° C.

22. The device of claim 21 wherein the device is a photovoltaic assembly.

23. The device of claim 21 wherein the device is a light emitting device.

24. The device of claim 21 wherein the device is capable of adopting a radius of curvature less than 1 meter.

* * * * *